United States Patent
Ooishi et al.

(10) Patent No.: US 6,567,324 B2
(45) Date of Patent: May 20, 2003

(54) SEMICONDUCTOR MEMORY DEVICE WITH REDUCED NUMBER OF REDUNDANT PROGRAM SETS

(75) Inventors: Tsukasa Ooishi, Hyogo (JP); Takeshi Hamamoto, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/119,782

(22) Filed: Apr. 11, 2002

(65) Prior Publication Data

US 2002/0196680 A1 Dec. 26, 2002

(30) Foreign Application Priority Data

Jun. 20, 2001 (JP) .......................... 2001-186763

(51) Int. Cl.⁷ ................................................. G11C 7/00
(52) U.S. Cl. ..................................... 365/200; 365/225.7
(58) Field of Search ............................. 365/200, 225.7, 365/230.03

(56) References Cited

U.S. PATENT DOCUMENTS

| | | | | |
|---|---|---|---|---|
| 5,625,596 A | * | 4/1997 | Uchida | ....................... 365/200 |
| 6,011,735 A | | 1/2000 | Ooishi et al. | ................ 365/200 |
| 6,349,064 B1 | * | 2/2002 | Nakaoka | ...................... 365/200 |
| 6,411,556 B1 | * | 6/2002 | Amano | ........................ 365/200 |
| 6,438,044 B2 | * | 8/2002 | Fukuda | ........................ 365/200 |

OTHER PUBLICATIONS

"Redundancy Techniques for High–Density DRAMs", Masashi Horiguchi, 1996 Innovative Systems in Silicon Conference, pp. 22–29.

* cited by examiner

Primary Examiner—Trong Phan
(74) Attorney, Agent, or Firm—McDermott, Will & Emery

(57) ABSTRACT

A setting circuit provided at a central part of a chip to set a replacement address includes seven redundancy determining units, each of which includes a program set. Each of four banks are divided into half to provide the total of eight regions. Eight control buses are provided transmitting data corresponding to the eight regions respectively. A bus determining unit selects a corresponding control bus in accordance with the contents of the program set and outputs replacement information. Therefore, each of the seven program sets can be used for replacement in any of the eight regions.

11 Claims, 11 Drawing Sheets

SEMICONDUCTOR MEMORY DEVICE WITH REDUCED NUMBER OF REDUNDANT PROGRAM SETS

BACKGROUND OF THE INVENTION

1. Field of the Invention

The present invention relates to a semiconductor memory device, and more particularly, to a semiconductor memory device capable of replacement of a defective memory cell by a redundant memory array.

2. Description of the Background Art

In recent years, a semiconductor memory device generally includes a redundant memory array, and even if a defect occurs in a part of memory cells in the manufacturing process, a memory array near the defective part of the memory cells is replaced by the redundant memory array to relieve the device.

FIG. 11 is a schematic diagram showing the configuration of a semiconductor memory device 500 including a conventional redundant memory array.

Referring to FIG. 11, conventional semiconductor memory device 500 includes memory banks BANK0 to BANK3 that can operate independently.

Memory bank BANK0 includes a memory cell array 504 having column selecting line YS00 in which a plurality of normal memory cells are arranged, and a redundant memory array 506 having spare column selecting line SYS0 in which a plurality of spare memory cells are arranged.

Memory bank BANK1 includes a memory cell array 514 having column selecting line YS10 in which a plurality of normal memory cells are arranged, and a redundant memory array 516 having spare column selecting line SYS1 in which a plurality of spare memory cells are arranged.

Memory bank BANK2 includes a memory cell array 524 having column selecting line YS20 in which a plurality of normal memory cells are arranged, and a redundant memory array 526 having spare column selecting line SYS2 in which a plurality of spare memory cells are arranged.

Memory bank BANK3 includes a memory cell array 534 having column selecting line YS30 in which a plurality of normal memory cells are arranged, and a redundant memory array 536 having spare column selecting line SYS3 in which a plurality of spare memory cells are arranged.

Semiconductor memory device 500 further includes redundancy determining circuits 502, 512, 522 and 532 activating redundant memory arrays 506, 516, 526 and 536, respectively, in accordance with an address signal ADR.

It is noted that a redundant memory array often includes a row-related redundant memory array mainly relieving a word line from defectiveness and a column-related redundant memory array mainly relieving a bit line from defectiveness, and FIG. 11 shows the case with the column-related memory array as a representative.

As shown in FIG. 11, conventional semiconductor memory device 500 including redundant memory arrays was provided with redundancy determining circuits of the number corresponding to that of the redundant memory arrays. Moreover, each redundancy determining circuit was often arranged in the vicinity of a corresponding redundant memory array.

If a defect occurs in a memory cell column selected by a column selecting line YS00, in response to an input of address signal ADR corresponding to the defective memory cell column, the redundancy determining circuit activates a spare column selecting line SYS0 in place of column selecting line YS00. Thus, input data is stored in the redundant memory array. It is noted that a decoder selecting a normal column is inactivated at that moment.

Therefore, it is required for the redundancy determining circuit to store an address of a defective memory cell in a non-volatile manner. As a means therefor, e.g. a fuse element is often used. The fuse element is blown off by a laser beam or the like. In order to ensure disconnection and to avoid harming the adjacent elements, the fuse element must have a certain size, and no other elements should be arranged around the fuse element. Hence, as the number of provided redundant memory arrays becomes larger, the redundancy determining circuit occupies a larger area on a chip.

In a recent dynamic random access memory (DRAM) with a large capacity and increased operation speed, a memory array is divided into a plurality of banks, and control thereof has become complicated. For example, while redundant memory arrays and redundancy determining circuits that are dispersed in the banks can also be collectively arranged at one place so as to be used for a defect occurred in any bank, the redundant memory cell array may desirably be configured to share a word line or bit line with a normal memory cell when the operation speed is given a high priority. This is because a signal delay of the word line or bit line can be disregarded in such a case.

Though the redundancy determining circuits are provided corresponding to the redundant memory arrays respectively, as described earlier, only a part of the redundancy determining circuits is used per chip for relieving the device from defectiveness when a defective portion actually occurs in the conventional configuration.

The redundancy determining circuit has a fuse element or the like having a large area used for setting an address. This has caused a problem in that unused redundancy determining circuits occupy a large area on the chip.

SUMMARY OF THE INVENTION

An object of the present invention is to provide a semiconductor memory device in which increase of a chip area occupied by redundancy determining circuits is alleviated by sharing only the redundancy determining circuit portion to reduce the number of the redundancy determining circuits.

According to an aspect of the present invention, a semiconductor memory device includes n memory regions, n selecting circuits, n control buses and a setting circuit (n is a natural number equal to or higher than 2).

Each of the n memory regions includes a normal memory region, and a replacement region replacing a partial region of the normal region when an operation failure is found in the partial region.

The n selecting circuits are provided respectively corresponding to the n memory regions, and each select the replacement region instead of the partial region in accordance with selection information.

The n control buses transmit the selection information to the n selecting circuits, respectively. The setting circuit holds, when specific information indicating a partial region is set, the specific information in a non-volatile manner, and compares an input address signal with the specific information, to output the selection information.

The setting circuit includes m program sets setting m pieces of the specific information, respectively, and m bus selecting and outputting circuits selecting any one of the n control buses and outputting the selection information (m is a natural number equal to or higher than 1).

Therefore, a main advantage of the present invention is that, since the bus selecting and outputting circuits are provided respectively corresponding to the memory regions to select a control bus and to output the selection information, the number of program sets can be determined irrespective of the number of memory regions or replacement regions and therefore the number of program sets can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
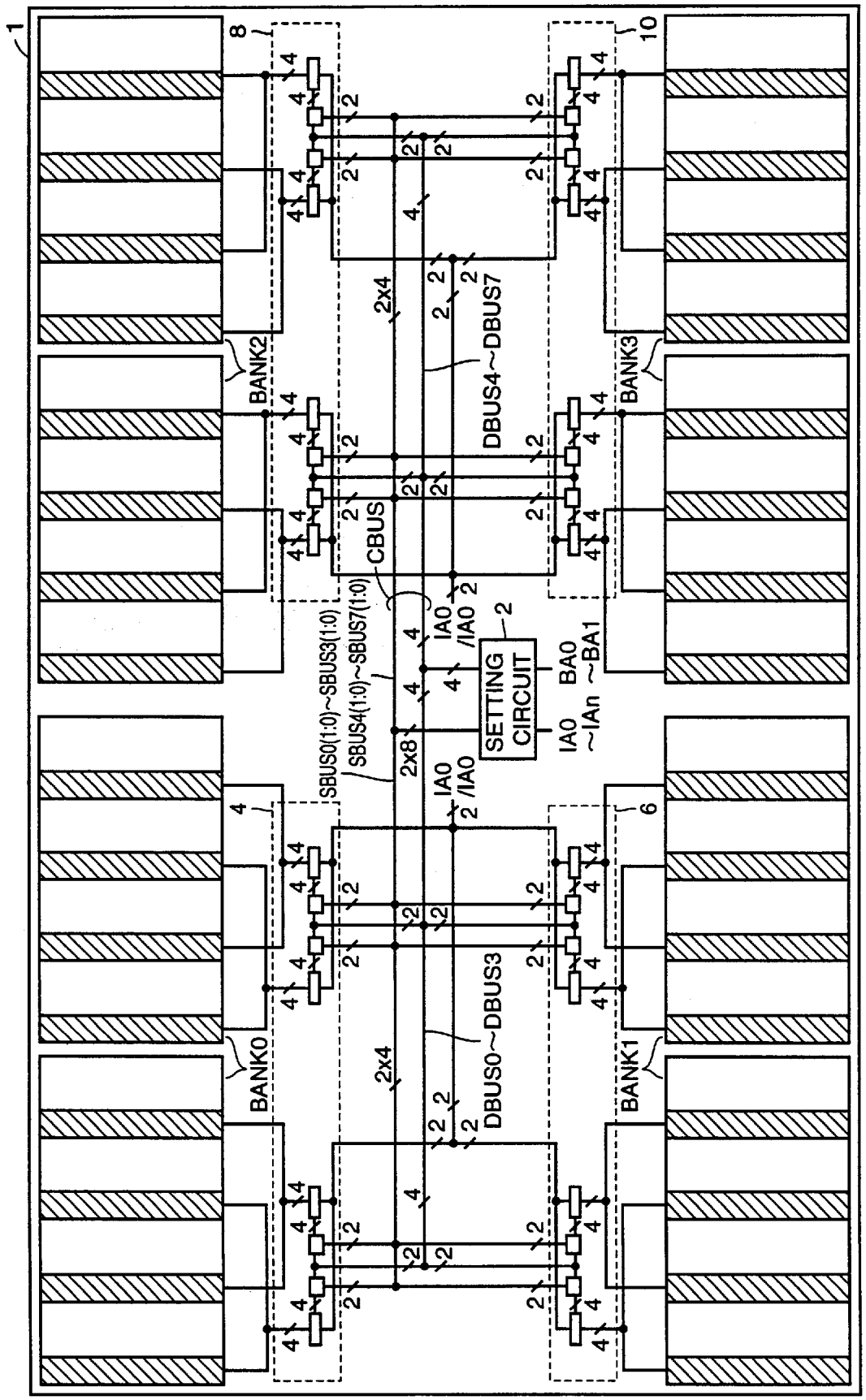
FIG. 1 is a schematic block diagram showing the configuration of a semiconductor memory device 1 according to an embodiment of the present invention.

An embodiment of the present invention will be described below in detail with reference to the drawings. It is noted that the same reference characters in the drawings denote the same or corresponding portions.

FIG. 1 is a schematic block diagram showing the configuration of a semiconductor memory device 1 according to an embodiment of the present invention.

Referring to FIG. 1, semiconductor memory device 1 includes memory banks BANK0 to BANK3 that can operate independently. Semiconductor memory device 1 is a DRAM of 256 Mbits. Each of memory banks BANK0 to BANK3 has a storage capacity of 64 Mbits.

Though not shown, each bank includes a row decoder selecting a row of memory cells and a column decoder selecting a column of memory cells, in accordance with an address signal and a bank address signal.

Each bank includes a normal memory region and a spare redundant memory region. When an operation failure is found in a partial region of the normal memory region, the spare redundant memory region is used to relieve the semiconductor device.

Semiconductor memory device 1 further includes a setting circuit 2 receiving address signals IA0 to IAn and bank address signals IB0, IB1 and outputting selection information of a redundant memory region when the received signals agree with an address of defect which is held inside; a control bus CBUS transmitting the selection information output from setting circuit 2; and main selecting circuits 4, 6, 8 and 10, each of which receiving the selection information from control bus CBUS and activating a redundant memory array in a corresponding bank. Main selecting circuits 4, 6, 8 and 10 are provided respectively corresponding to banks BANKs 0, 1, 2 and 3.

Control bus CBUS includes a signal line transmitting redundancy activation signals DBUS0 to DBUS7, and a signal line transmitting redundancy select signals SBUS0 to SBUS7.

Redundancy activation signals DBUS0 to DBUS7 are signals activated when a replacement address set within setting circuit 2 agrees with input address signals IA0 to IAn and bank address signals IB0, IB1. Redundancy select signals SBUS0 (1:0) to SBUS7 (1:0) are signals transmitted from setting circuit 2 to main selecting circuits 4–10 together with redundancy activation signals DBUS0 to DBUS7, and each of the signals selects one of the plurality of redundancy regions included in a bank corresponding to a main selecting circuit to which the signal is transmitted.

The least significant bit IA0 of an address is input into each of main selecting circuits 4 to 10 as a complementary selection signal, and is used in conjunction with the redundancy select signal and redundancy activation signal to specify a redundant region to be activated according to an address input.

Figure 2:
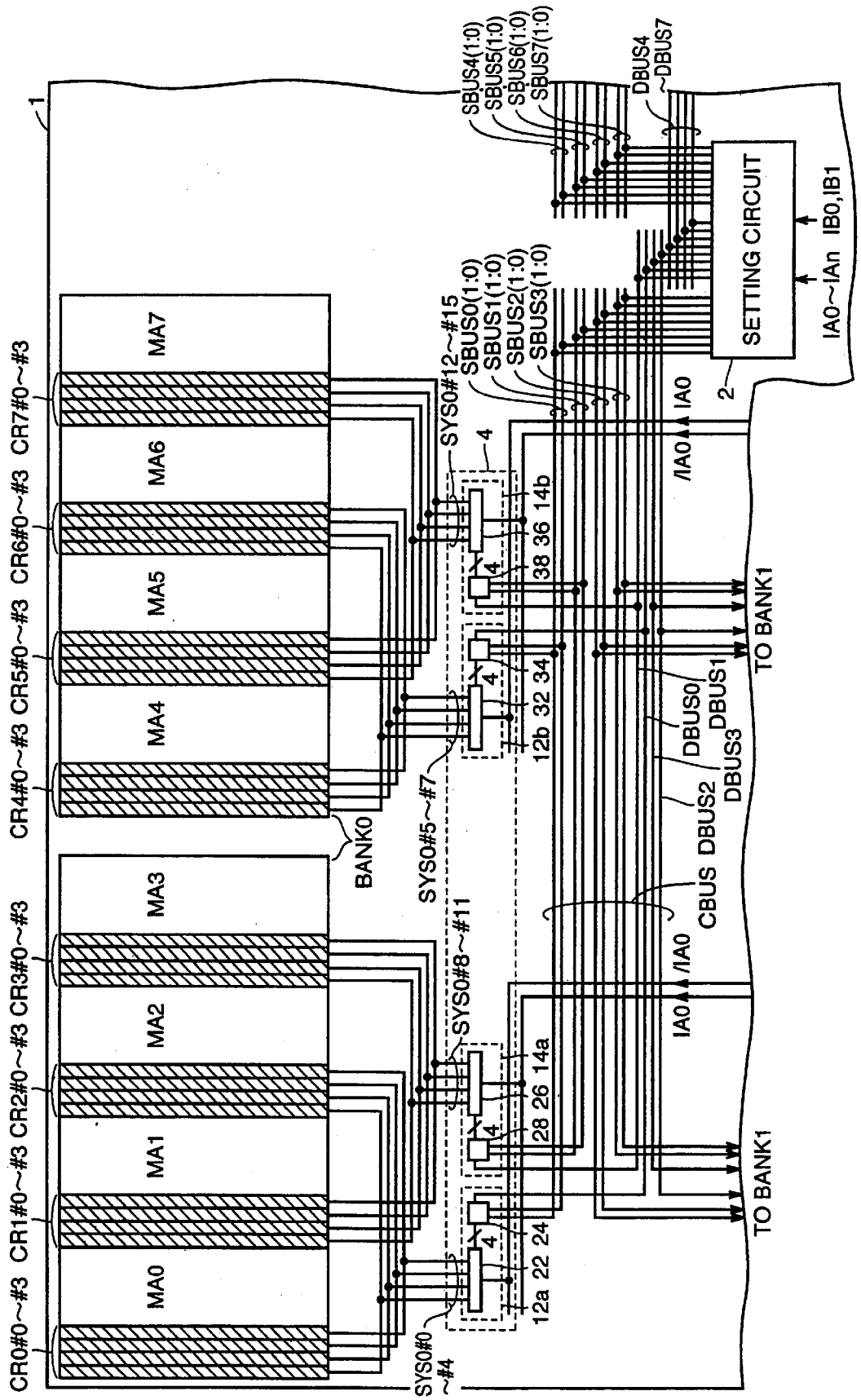
FIG. 2 illustrates more detailed configurations of a memory bank BANK0, a main selecting circuit 4 and a control bus CBUS.

FIG. 2 illustrates a more detailed configuration of memory bank BANK0, main selecting circuit 4 and control bus CBUS in FIG. 1.

Referring to FIG. 2, memory bank BANK0 of 64 Mbits is further divided into half banks of 32 Mbits. Each of the half banks is further divided into four memory blocks, each of which includes four sets of input/output lines. Each set of the input/output lines includes a local input/output line and a main input/output line. When externally accessed, column selecting line CSL is activated in each of the four blocks in each half bank, and total of 16 sets of input/output lines are selected.

Each of memory banks BANKs 1 to 3 (not shown) has a configuration similar to that of memory bank BANK0, so that the description thereof will not be repeated.

Bank BANK0 includes memory blocks MA0 to MA7, redundant columns CR0#0 to CR0#3 provided corresponding to memory block MA0, redundant columns CR1#0 to CR1#3 provided corresponding to memory block MA1, redundant columns CR2#0 to CR2#3 provided corresponding to memory block MA2, and redundant columns CR3#0 to CR3#3 provided corresponding to memory block MA3.

Bank BANK0 further includes redundant columns CR4#0 to CR4#3 provided corresponding to memory block MA4, redundant columns CR5#0 to CR5#3 provided corresponding to memory block MA5, redundant columns CR6#0 to CR6#3 provided corresponding to memory block MA6, redundant columns CR7#0 to CR7#3 provided corresponding to memory block MA7.

Main selecting circuit 4 includes a sub selecting circuit 12a receiving redundancy activation signal DBUS0 and redundancy select signal SBUS0 (1:0) from control bus CBUS and activating the signals according to address bit signal /IA0 to output redundant column selection signals SYS0#0 to SYS0#4; and a sub selecting circuit 12b receiving redundancy activation signal DBUS0 and redundancy select signal SBUS0 (1:0) from control bus CBUS and activating the signals according to address bit signal IA0 to output redundant column selection signals SYS0#5 to SYS0#7.

Main selecting circuit 4 further includes a sub selecting circuit 14a receiving redundancy activation signal DBUS1 and redundancy select signal SBUS1 (1:0) from control bus CBUS and activating the signals according to address bit signal IA0 to output redundant column selection signals SYS0#8 to SYS0#11; and a sub selecting circuit 14b receiving redundancy activation signal DBUS1 and redundancy select signal SBUS1 (1:0) from control bus CBUS and activating the signals according to address bit signal/IA0 to output redundant column selection signals SYS0#12 to SYS0#15.

Sub selecting circuit 12a includes a decoder 24 activated in accordance with redundancy activation signal DBUS0, to decode redundancy select signal SBUS0 (1:0) to output selection signals of 4 bits; and an output circuit 22 activated in accordance with signal /IA0 to output an output of decoder 24 as redundant column selection signals SYS#0 to SYS0#4.

Sub selecting circuit 12b includes a decoder 34 activated in accordance with redundancy activation signal DBUS0, to decode redundancy select signal SBUS0 (1:0) to output selection signals of 4 bits; and an output circuit 32 activated in accordance with signal IA0 to output an output of decoder 34 as redundant column selection signals SYS0#5 to SYS0#7.

Sub selecting circuit 14a includes a decoder 28 activated in accordance with redundancy activation signal DBUS1, to decode redundancy select signal SBUS1 (1:0) to output selection signals of 4 bits; and an output circuit 36 activated in accordance with signal IA0 to output an output of decoder 28 as redundant column selection signals SYS0#8 to SYS0#11.

Sub selecting circuit 14b includes a decoder 38 activated in accordance with redundancy activation signal DBUS1, to decode redundancy select signal SBUS1 (1:0) to output selection signals of 4 bits; and an output circuit 36 activated in accordance with signal IA0 to output an output of decoder 38 as redundancy column selection signals SYS0#12 to SYS0#15.

Redundant columns CR0#0 and CR2#0 are simultaneously activated in response to redundant column selection signal SYS0#0 being activated. Redundant columns CR0#1 and CR2#1 are simultaneously activated in response to redundant column selection signal SYS0#1 being activated. Redundant columns CR0#2 and CR2#2 are simultaneously activated in response to redundant column selection signal SYS0#2 being activated. Redundant columns CR0#3 and CR2#3 are simultaneously activated in response to redundant column selection signal SYS0#3 being activated.

Redundant columns CR1#0 and CR3#0 are simultaneously activated in response to redundant column selection signal SYS0#8 being activated. Redundant columns CR1#1 and CR3#1 are simultaneously activated in response to redundant column selection signal SYS0#9 being activated. Redundant columns CR1#2 and CR3#2 are simultaneously activated in response to redundant column selection signal SYS0#10 being activated. Redundant columns CR1#3 and CR3#3 are simultaneously activated in response to redundant column selection signal SYS0#11 being activated.

Redundant columns CR4#0 and CR6#0 are simultaneously activated in response to redundant column selection signal SYS0#5 being activated. Redundant columns CR4#1 and CR6#1 are simultaneously activated in response to redundant column selection signal SYS0#6 being activated. Redundant columns CR4#2 and CR6#2 are simultaneously activated in response to redundant column selection signal SYS0#7 being activated. Redundant columns CR4#3 and CR6#3 are simultaneously activated in response to redundant column selection signal SYS0#8 being activated.

Redundant columns CR5#0 and CR7#0 are simultaneously activated in response to redundant column selection signal SYS0#12 being activated. Redundant columns CR5#1 and CR7#1 are simultaneously activated in response to redundant column selection signal SYS0#13 being activated. Redundant columns CR5#2 and CR7#2 are simultaneously activated in response to redundant column selection signal SYS0#14 being activated. Redundant columns CR5#3 and CR7#3 are simultaneously activated in response to redundant column selection signal SYS0#15 being activated.

As such, redundant columns in two different blocks are used in a pair. If either one of the two blocks is defective, a spare column selecting line in the other block is also activated. This makes the total of 32 spare column selecting lines per bank, and replacement is performed for two columns at a time, so that 16 sets of replacement can be performed.

In the sets of the redundancy columns, at the maximum of two sets per bank may be simultaneously activated. For example, in a double data rate synchronous DRAM (DDR SDRAM), successive even address and odd address are used in a pair and are simultaneously activated within one bank. The simultaneous activation occurs when both of the simultaneously-activated address pair happen to have defective memory cells.

In the entire chip shown in FIG. 1, 64 sets of replacement regions exist in four banks. In such a conventional case, 64 program sets for setting replacement addresses were required. Whereas, in semiconductor memory device 1 according to the present invention, program sets are included within setting circuit 2 arranged at the central part, and only seven program sets are provided.

As will be described later, provision of a bus selecting and outputting circuit within a setting circuit eliminates the need for particularly making the number of redundancy replacement sets agree with the number of program sets. Thus, any integer smaller than the total number of redundant replacement sets may be employed. For example, while the number of banks is normally a multiplier of 2, the number of program sets may be determined irrespective of the number of banks.

Figure 3:
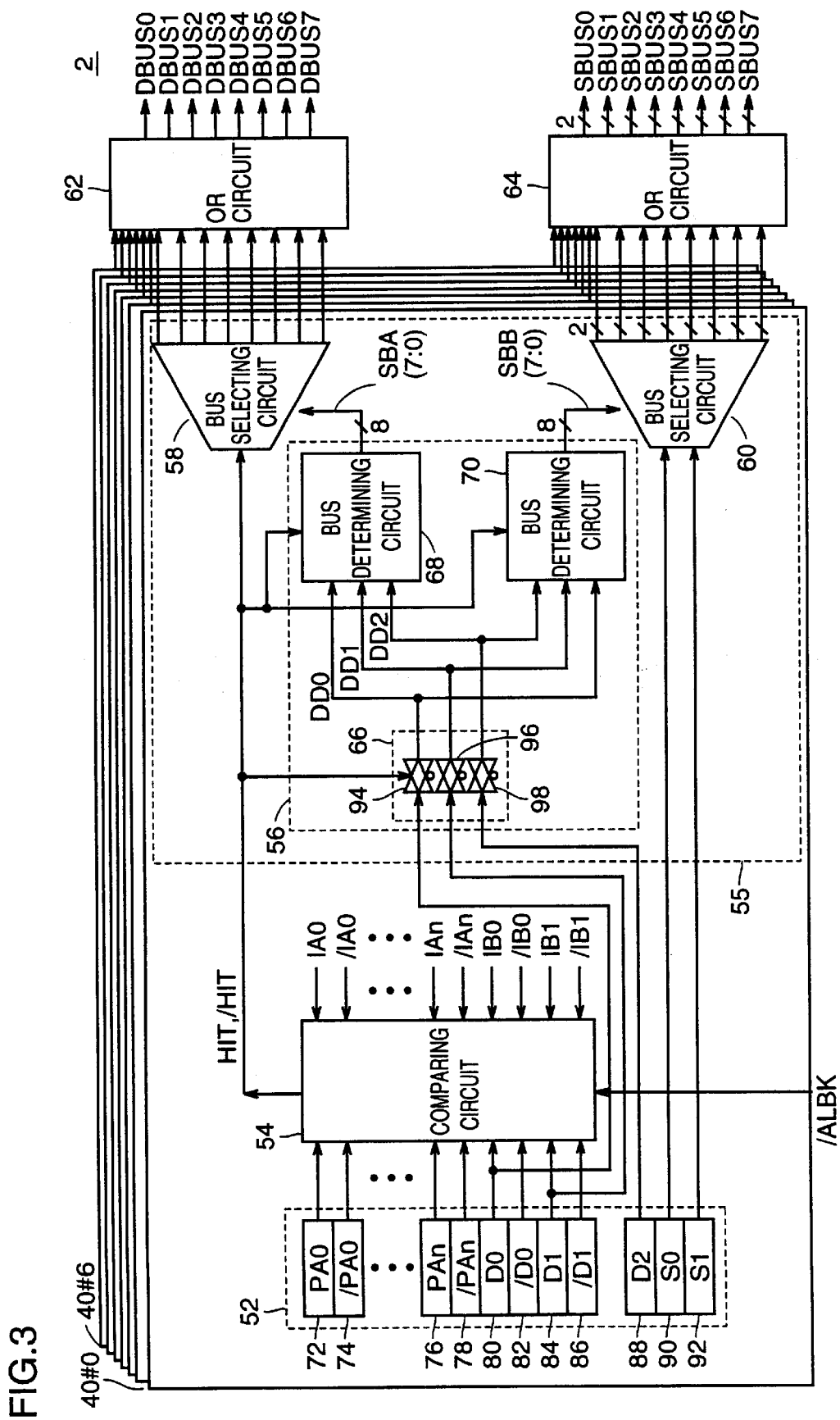
FIG. 3 is a circuit diagram showing the configuration of a setting circuit 2 in FIG. 2.

Referring to FIG. 3, setting circuit 2 includes redundancy determining circuits 40#0 to 40#6, each of which receives address signals IA0 to IAn, /IA0 to IAn and bank address signals IB0, IB1, /IB0 and /IB1, to compare the signals with a replacement address held in each circuit to determine whether or not replacement by a redundant column is performed; an OR circuit 62 receiving outputs of redundancy determining circuits 40#0 to 40#6 to output redundancy activation signals DBUS0 to DBUS7; and an OR circuit 64 receiving outputs of redundancy determining circuits 40#0 to 40#6 to output redundancy select signals SBUSO to SBUS7.

Redundancy determining circuit 40#0 includes a program set 52 that can set, in a non-volatile manner, information specifying a replacement address and a redundant region to be used; and a comparing circuit 54 receiving the information on the replacement address from program set 52 to compare the replacement address information with the address signal and bank address signal that are input, to output signals HIT, /HIT indicating whether or not the replacement by a redundant column is performed; a bus selecting and outputting circuit 55 activated in accordance with an output of comparing circuit 54 to select a control bus transmitting a signal to a region corresponding to the replacement address information and to output an activation signal and a redundancy selection signal.

Program set 52 includes a program unit 72 setting an address bit PA0 of the replacement address corresponding to address bit IA0 of the input address; a program unit 74 setting a replacement address bit /PA0 corresponding to address bit /IA0, a program unit 76 setting a replacement address bit PAn corresponding to address bit IAn; and a program unit 78 setting a replacement address bit /PAn corresponding to address bit /IAn.

Program set 52 further includes program units 80, 82, 84 and 86 respectively setting replacement address bits D0, /D0, D1 and /D1 respectively corresponding to address bits IB0, /IB0, IB1 and /IB1 of the bank address.

Program set 52 further includes program units 88, 90 and 92 for setting signal bits D2, S0 and S1 respectively. Signal bit D2 indicates which one of the two regions included in the bank specified by replacement address bits D0, /D0, D1 and /D1 has a defective column to be replaced. Signal bits S0, S1 indicate which of the four pairs of the redundant columns included in each of the regions indicated by signal bit D2 is used for replacement.

Bus selecting and outputting circuit 55 includes a bus determining unit 56 and bus selecting circuits 58 and 60.

Bus determining unit 56 includes a read circuit 66 activated in accordance with an output of comparing circuit 54 to transmit signal bits D0, D1 and D2 as signals DD0, DD1 and DD2, respectively; a bus determining circuit 68 activated in accordance with an output of comparing circuit 54 to decode signals DD0 to DD2 and to output a selection signal SBA (7:0) of a control bus to be used; and a bus determining circuit 70 decoding signals DD0 to DD2 in accordance with an output of comparing circuit 54 to decode signals DD0 to DD2 and to output a bus selection signal SBB (7:0).

Read circuit 66 includes transmission gates 94, 96 and 98 transmitting signal bits D0, D1 and D2 respectively, in accordance with signals HIT, /HIT.

Bus selecting circuit 58 outputs an activation signal HIT to a corresponding control bus in accordance with bus selection signal SBA (7:0). Bus selecting circuit 60 outputs redundancy selection signal bits S0, S1 to a corresponding control bus in accordance with bus selection signal SBB (7:0).

Figure 4:
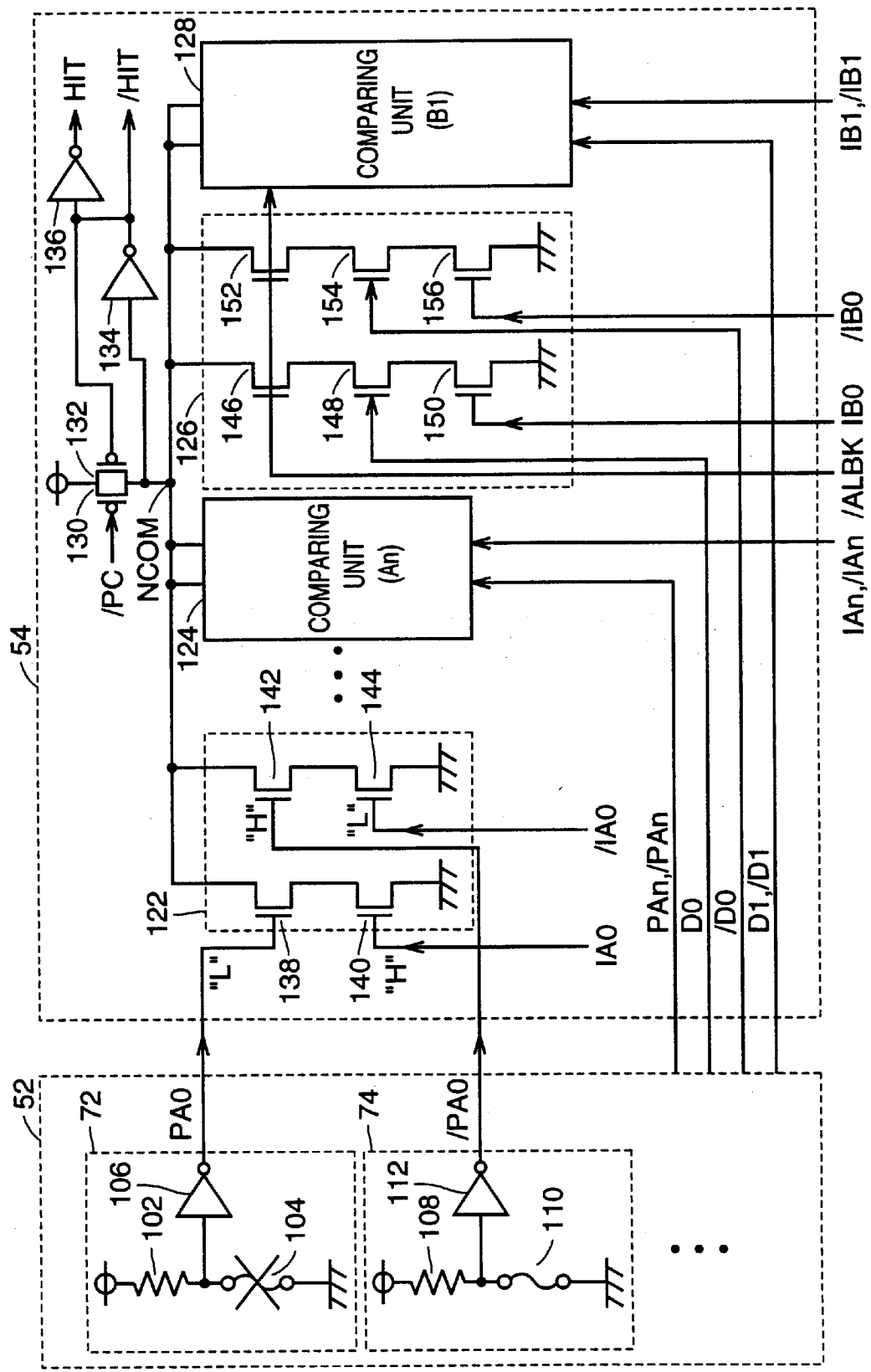
FIG. 4 is a circuit diagram showing the details of a program set 52 and a comparing circuit 54 in FIG. 3.

FIG. 4 is a circuit diagram showing the details of program set 52 and comparing circuit 54 in FIG. 3.

Referring to FIG. 4, program unit 72 included in program set 52 includes a resistance 102 and a fuse element 104 connected in series between a power-supply node and a ground node; and an inverter 106 whose input is connected to a node connecting resistance 102 and fuse element 104 to output signal bit PA0.

Program unit 74 includes a resistance 108 and a fuse element 110 connected in series between the power-supply node and the ground node; and an inverter 112 whose input is connected to a node connecting resistance 108 and fuse element 110 to output signal bit /PA0.

Comparing circuit 54 includes a comparing unit 122 receiving signal bits IA0, /IA0 and signal bits PA0, /PA0 for performing comparing operation with respect to address bit A0; and a comparing unit 124 receiving signal bits IAn, /IAn and signal bits PAn, /PAn for performing comparing operation with respect to address bit An.

Comparing circuit 54 further includes a comparing unit 126 comparing signal bits IB0, /IB0 and signal bits D0, /D0 when an all-bank activation signal /ALBK is inactivated; and a comparing unit 128 comparing signal bits IB1, /IB1 and signal bits D1, /D1 when all-bank activation signal /ALBK is inactivated.

Comparing units 122 to 124, 126 and 128 are connected to a node NCOM.

Comparing circuit 54 further includes a P-channel MOS transistor 130 connected between the power-supply node and node NCOM to receive a pre-charge signal /PC at the gate thereof; an inverter 134 whose input is connected to node NCOM to output signal /HIT; an inverter 136 receiving an output of inverter 134 to output signal HIT; and a P-channel MOS transistor 132 connected between the power-supply node and node NCOM to receive an output of inverter 134 at the gate thereof.

Comparing unit 122 includes N-channel MOS transistors 138, 140 connected in series between node NCOM and the ground node to receive signal bits PA0, IA0 at the gates thereof, respectively; and N-channel MOS transistors 142, 144 connected in series between node NCOM and the ground node to receive signal bits /PA0, /IA0 at the gates thereof, respectively.

Comparing unit 124 has a configuration similar to that of comparing unit 122, so that the description thereof will not be repeated.

Comparing unit 126 includes N-channel MOS transistors 146, 148 and 150 connected in series between node NCOM and the ground node to receive signal /ALBK, signal bit D0 and signal bit IB0 at the gates thereof, respectively; and N-channel MOS transistors 152, 154 and 156 connected in series between node NCOM and the ground node to receive signal /ALBK and signal bits /D0, /IB0 at the gates thereof, respectively.

Comparing unit 128 has a configuration similar to that of comparing unit 126, so that the description thereof will not be repeated.

Briefly describing the comparing operation, when fuse elements within program set 52 are all conductive, both of signal bits PA0, /PA0 are set to be at a logic high or "H" level. Then, comparing unit 122 couples node NCOM to the ground potential in either case where address signal bit A0 is "1" or "0." Therefore, signal HIT is set to be at a logic low or "L" level, so that a redundant region will not be activated.

If it is desired to activate the redundant region when address bit A0 is 1, fuse element 104 is blown. Then, signal bit PA0 is set to be at "L." If address bit A0 of the input address signal is "1," "H" is applied as address bit IA0. At that time, "L" is applied as address bit /IA. Then, N-channel MOS transistor 140 is rendered conductive while N-channel MOS transistor 138 is non-conductive, so that no conductive path is formed. Similarly, even if N-channel MOS transistor 142 is conductive, N-channel MOS transistor remains non-conductive, so that no conductive path is formed.

Therefore, when input address bit A0 is "1," comparing unit 122 never connects node NCOM after being pre-charged to the ground potential.

Likewise, comparing unit 126 also performs comparing operation similar to that of comparing unit 122, when signal /ALBK is set to be at the H level, to compare a replacement address and an input address. Thus, when all of the comparing units 122 to 128 detect agreements, node NCOM maintains the H level after it is pre-charged. Therefore, signal HIT is set to be at the activated level of H level.

In the case with the test mode, refresh and so forth, in which all four banks are activated, signal /ALBK is set to be at the L level. Then, no conductive path is formed in comparing units 126, 128 performing comparison with respect to the bank addresses. Therefore, only input address bits A0 to An are subjected to comparison.

Figure 5:
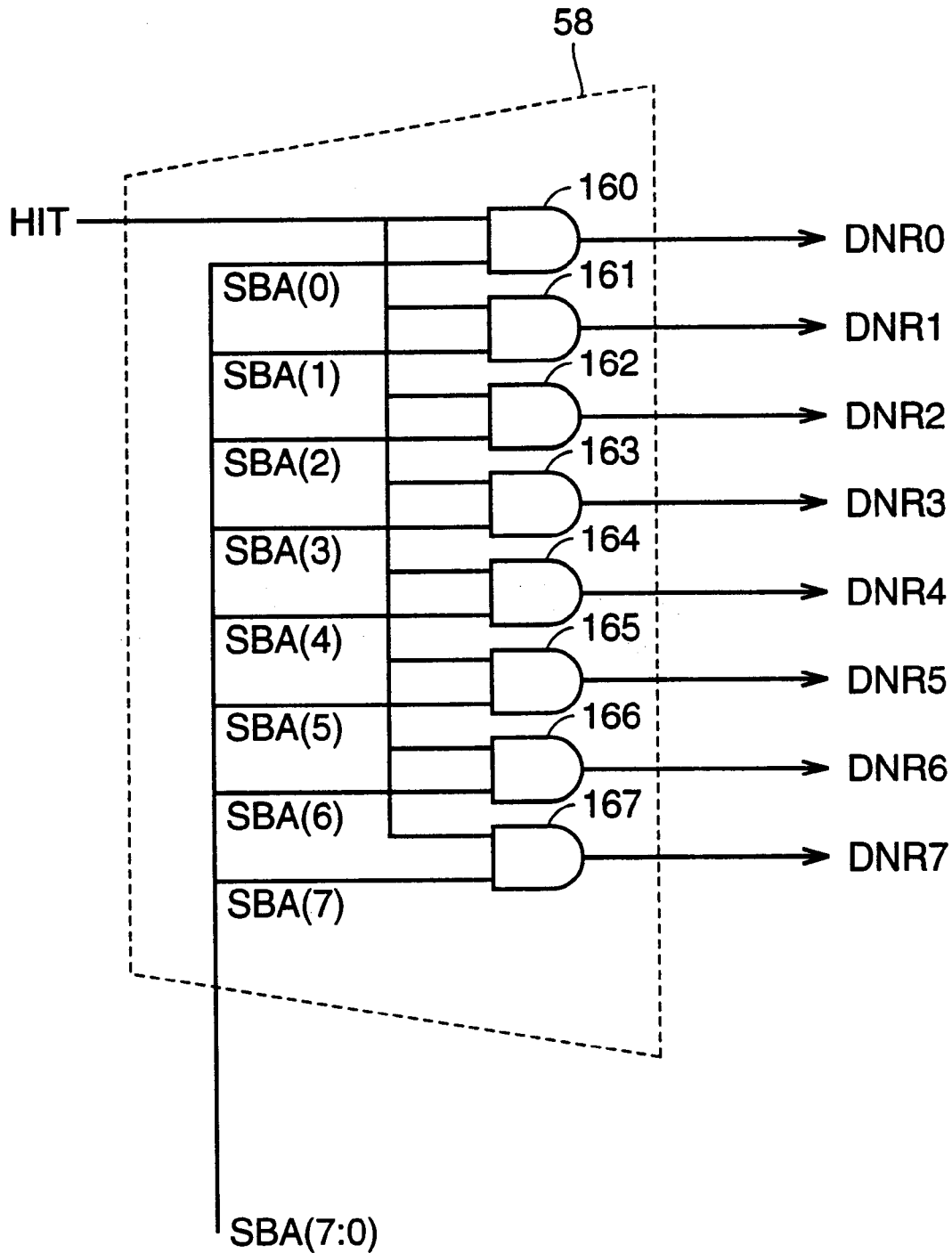
FIG. 5 is a circuit diagram showing the configuration of a bus selecting circuit 58 in FIG. 3.

FIG. 5 is a circuit diagram showing the configuration of bus selecting circuit 58 in FIG. 3.

Referring to FIG. 5, bus selecting circuit 58 includes an AND circuit 160 receiving signal HIT and a bus selection signal SBA (0) to output a redundancy activation signal DNR0, an AND circuit 161 receiving signal HIT and a bus selection signal SBA (1) to output a redundancy activation signal DNR1, an AND circuit 162 receiving signal HIT and a bus selection signal SBA (2) to output a redundancy activation signal DNR2, and an AND circuit 163 receiving signal HIT and a bus selection signal SBA (3) to output a redundancy activation signal DNR3.

Bus selecting circuit 58 further includes an AND circuit 164 receiving signal HIT and a bus selection signal SBA (4) to output a redundancy activation signal DNR4, an AND circuit 165 receiving signal HIT and a bus selection signal SBA (5) to output a redundancy activation signal DNR5, an AND circuit 166 receiving signal HIT and a bus selection signal SBA (6) to output a redundancy activation signal DNR6, and an AND circuit 167 receiving signal HIT and a bus selection signal SBA (7) to output a redundancy activation signal DNR7.

Figure 6:
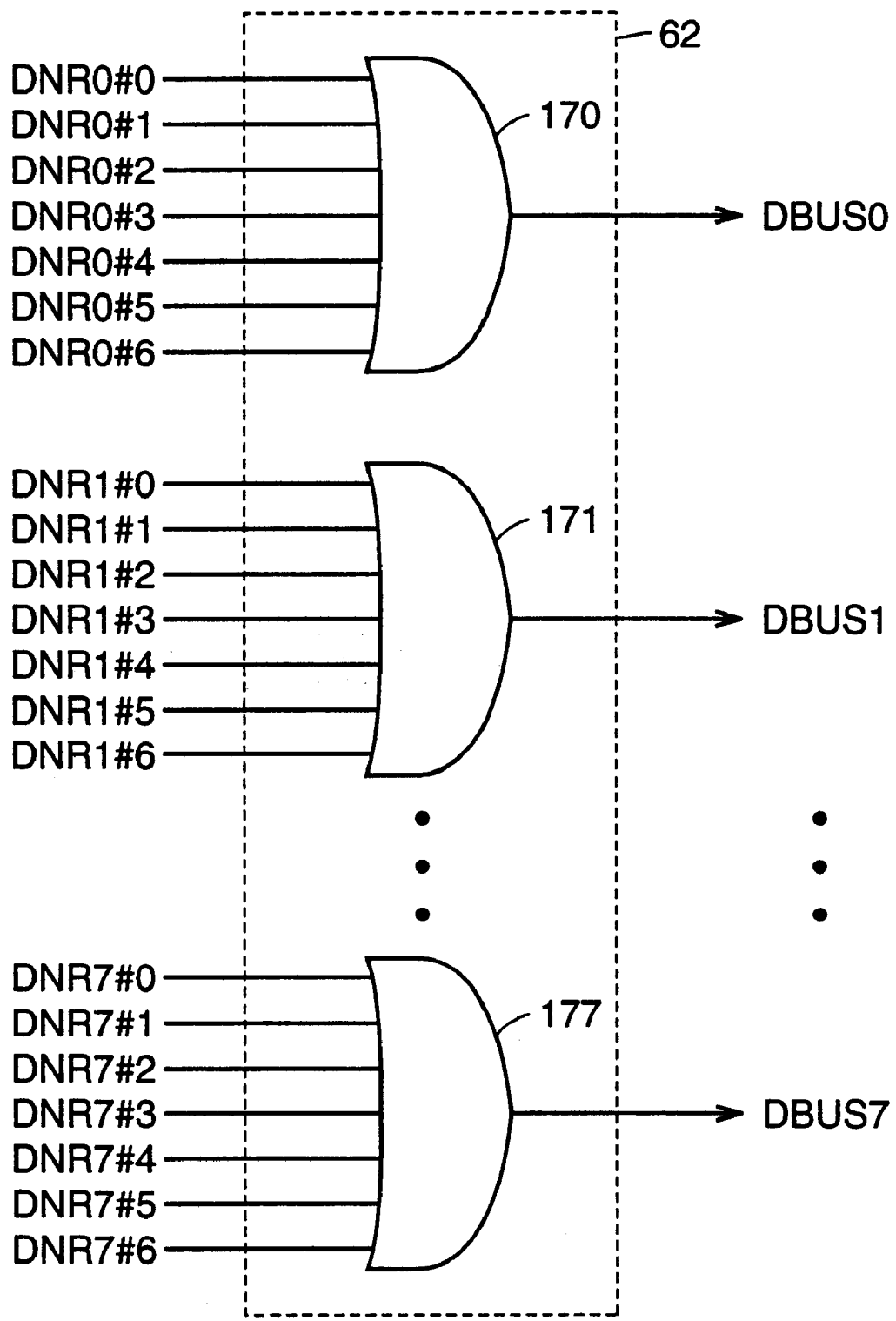
FIG. 6 is a circuit diagram showing the configuration of an OR circuit 62 in FIG. 3.

FIG. 6 is a circuit diagram showing the configuration of an OR circuit 62 in FIG. 3.

Referring to FIG. 6, activation signals DNR0#0 to DNR0#6 indicate redundancy activation signal DNR0 output from redundancy determining circuits 40#0 to 40#6 in FIG. 3, respectively. Activation signals DNR1#0 to DNR1#6 indicate redundancy activation signal DNR1 output from redundancy determining circuits 40#0 to 40#6 in FIG. 3, respectively. Activation signals DNR7#0 to DNR7#6 indicate redundancy activation signal DNR7 output from redundancy determining circuits 40#0 to 40#6 in FIG. 3, respectively.

OR circuit 62 includes an OR circuit 170 receiving redundancy activation signals DNR0#0 to DNR0#6 to output redundancy activation signal DBUS0, an OR circuit 171 receiving redundancy activation signals DNR1#0 to DNR1#6 to output redundancy activation signal DBUS1, . . . , and an OR circuit 177 receiving redundancy activation signals DNR7#0 to DNR7#6 to output redundancy activation signal DBUS7.

Figure 7:
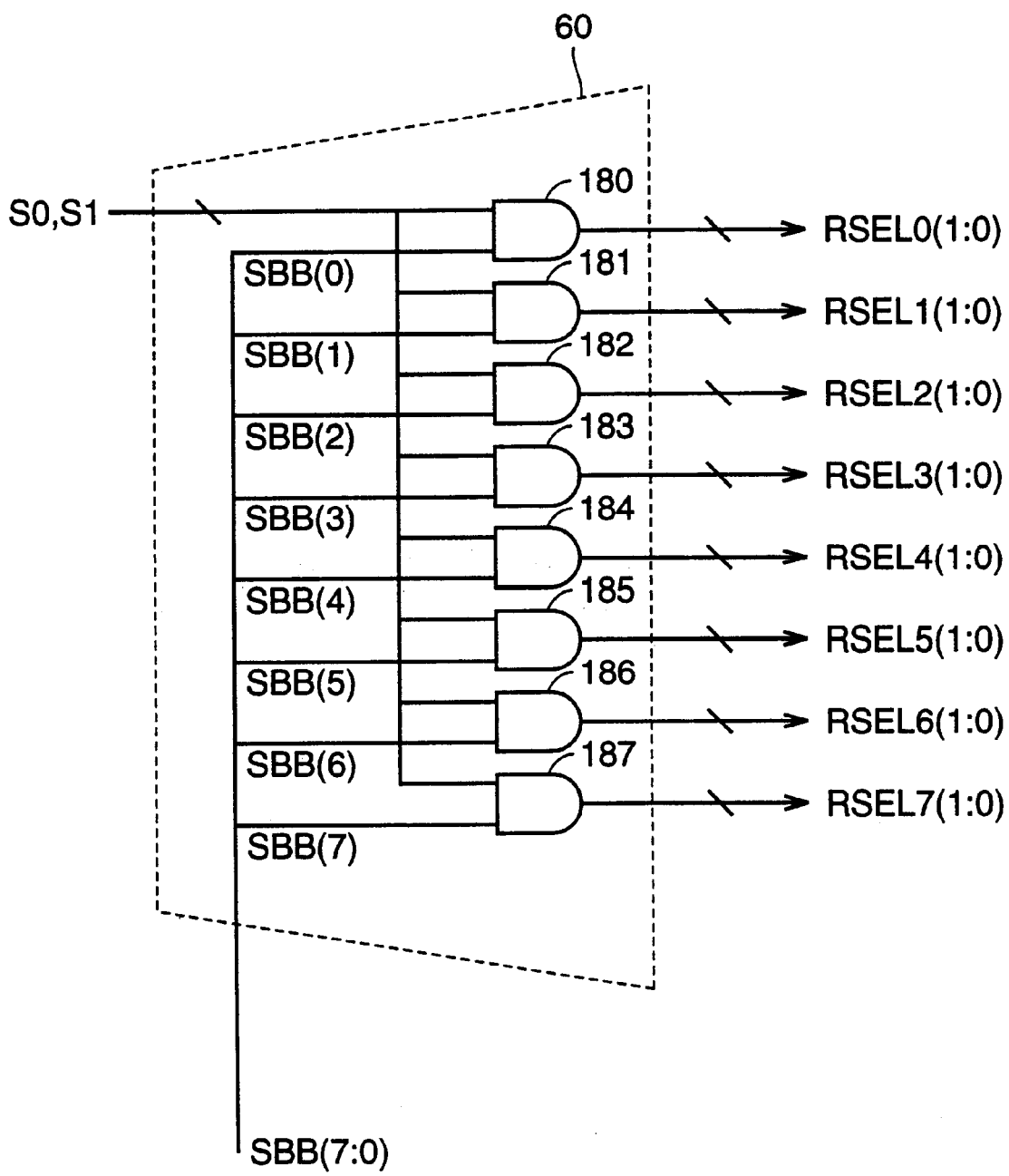
FIG. 7 is a circuit diagram showing the configuration of a bus selecting circuit 60 in FIG. 3.

FIG. 7 is a circuit diagram showing the configuration of bus selecting circuit 60 in FIG. 3.

Referring to FIG. 7, bus selecting circuit 60 includes an AND circuit 180 outputting redundancy selection signals S0, S1 as a redundancy selection signal RSEL0 (1:0) in accordance with a bus selection signal SBB (0), an AND circuit 181 outputting redundancy selection signals S0, S1 as a redundancy selection signal RSEL1 (1:0) in accordance with a bus selection signal SBB (1), an AND circuit 182 outputting redundancy selection signals S0, S1 as a redundancy selection signal RSEL2 (1:0) in accordance with a bus selection signal SBB (2), and an AND circuit 183 outputting redundancy selection signals S0, S1 as a redundancy selection signal RSEL3 (1:0) in accordance with a bus selection signal SBB (3).

Bus selecting circuit 60 further includes an AND circuit 184 outputting redundancy selection signals S0, S1 as a redundancy selection signal RSEL4 (1:0) in accordance with a bus selection signal SBB (4), an AND circuit 185 outputting redundancy selection signals S0, S1 as a redundancy selection signal RSEL5 (1:0) in accordance with a bus selection signal SBB (5), an AND circuit 186 outputting redundancy selection signals S0, S1 as a redundancy selection signal RSEL6 (1:0) in accordance with a bus selection signal SBB (6), and an AND circuit 187 outputting redundancy selection signals S0, S1 as a redundancy selection signal RSEL7 (1:0) in accordance with a bus selection signal SBB (7).

Figure 8:
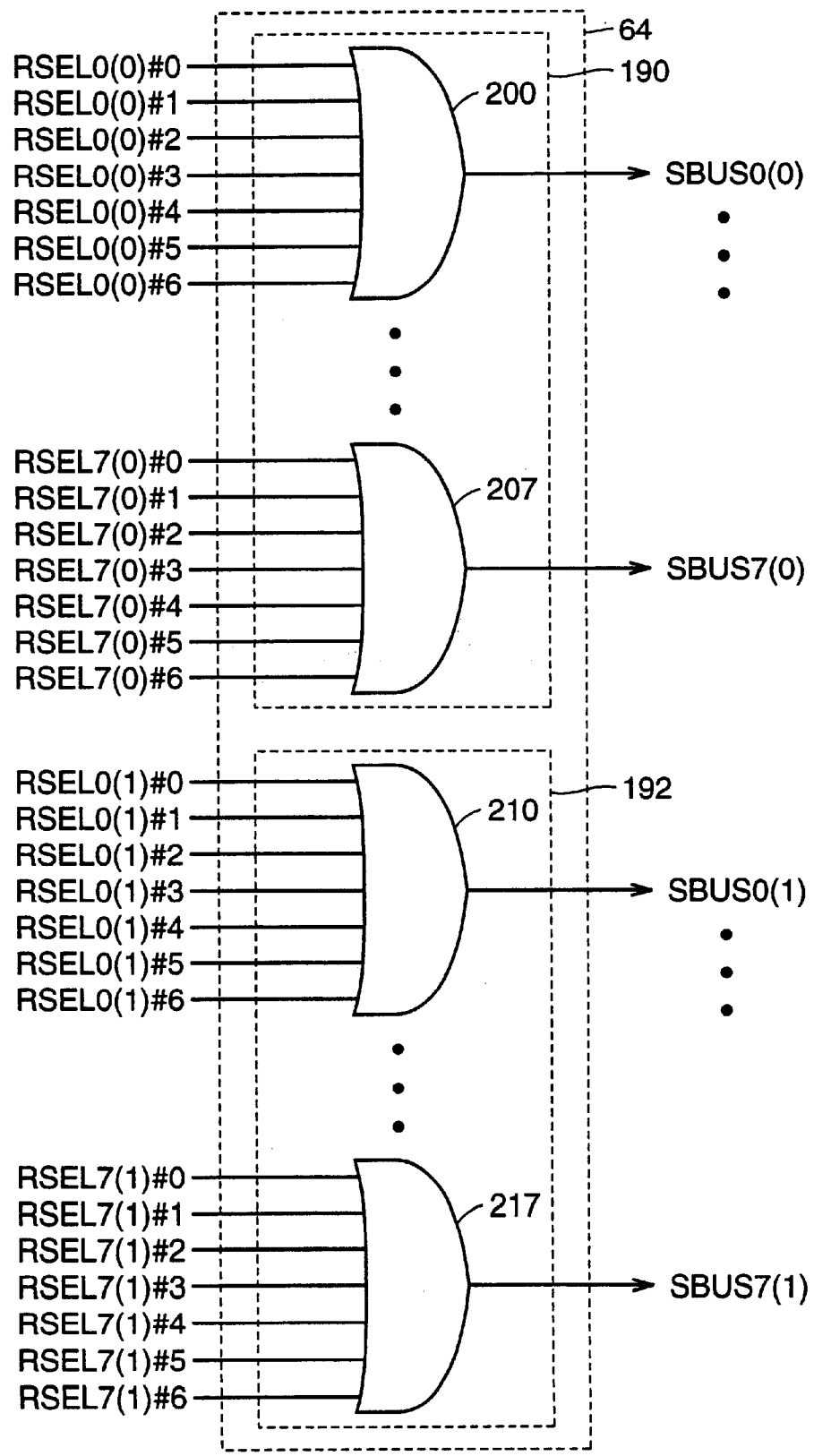
FIG. 8 is a circuit diagram showing the configuration of an OR circuit 64 in FIG. 3.

FIG. 8 is a circuit diagram showing the configuration of OR circuit 64 in FIG. 3.

Referring to FIG. 8, redundancy selection signals RSEL0 (0) #0 to RSEL0 (0) #6 indicate a redundancy selection signal RSEL0 (0) output from redundancy determining circuits 40#0 to 40#6 in FIG. 3, respectively. Redundancy selection signals RSEL7 (0) #0 to RSEL7 (0) #6 indicate a redundancy selection signal RSEL7 (0) output from redundancy determining circuits 40#0 to 40#6 in FIG. 3, respectively.

Redundancy selection signals RSEL0 (1) #0 to RSEL0 (1) #6 indicate a redundancy selection signal RSEL0 (1) output from redundancy determining circuits 40#0 to 40#6 in FIG. 3, respectively. Redundancy selection signals RSEL7 (1) #0 to RSEL7 (1) #6 indicate a redundancy selection signal RSEL7 (1) output from redundancy determining circuits 40#0 to 40#6 in FIG. 3, respectively.

OR circuit 64 includes an OR circuit 190 corresponding to bit S0, and an OR circuit 192 corresponding to bit S1.

OR circuit 190 includes an OR circuit 200 receiving redundancy selection signals RSEL0 (0) #0 to RSEL0 (0) #6 to output a redundancy selection signal SBUS0 (0), . . . , and an OR circuit 207 receiving redundancy selection signals RSEL7 (0) #0 to RSEL7 (0) #6 to output a redundancy selection signal SBUS7 (0).

OR circuit 192 includes an OR circuit 210 receiving redundancy selection signals RSEL0 (1) #0 to RSEL0 (1) #6 to output a redundancy selection signal SBUS0 (1), . . . , and an OR circuit 217 receiving redundancy selection signals RSEL7 (1) #0 to RSEL7 (1) #6 to output a redundancy selection signal SBUS7 (1).

Figure 9:
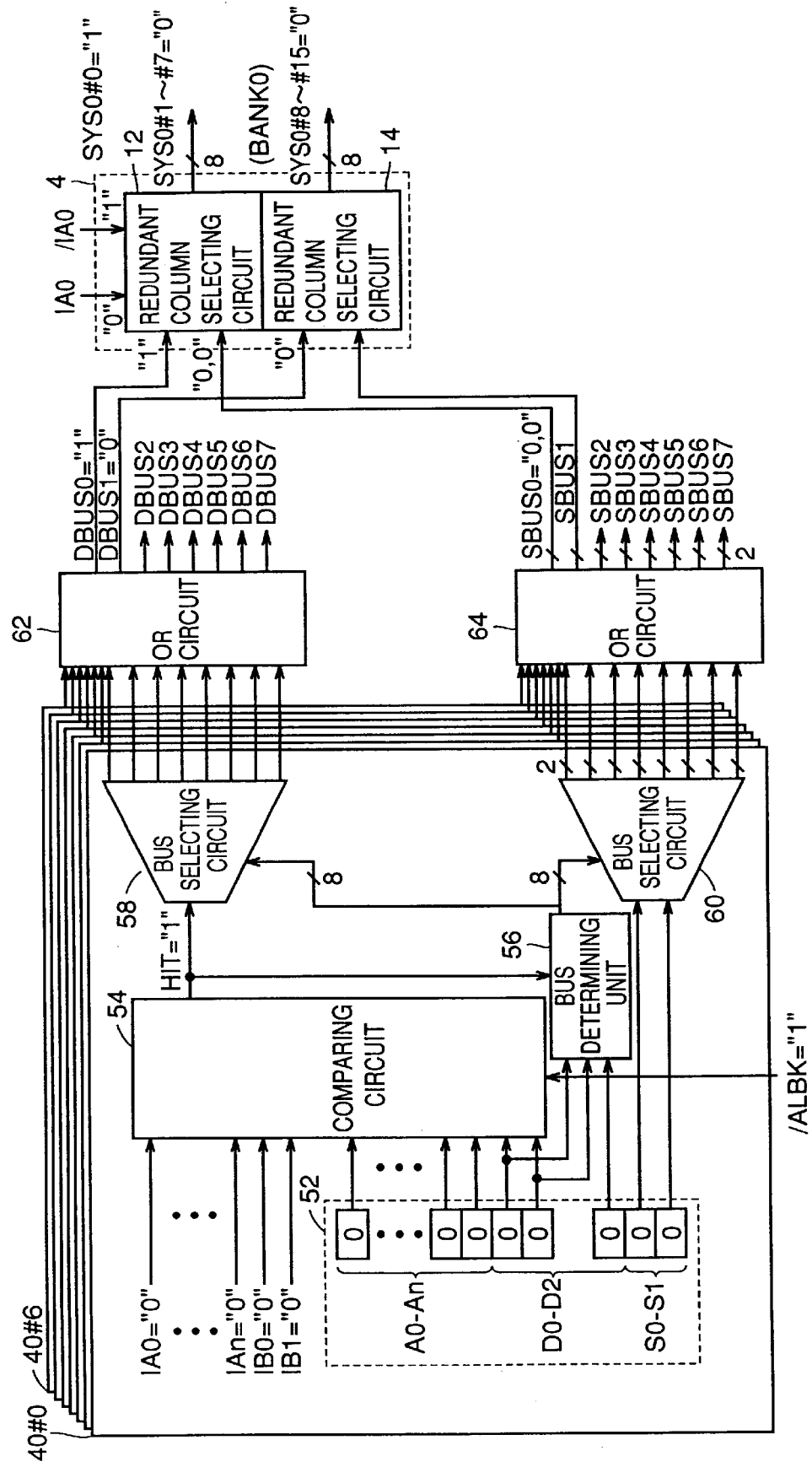
FIG. 9 is a schematic view illustrating the operation for selecting a redundant column at the time of normal accessing.

FIG. 9 is a schematic view illustrating the operation for selecting a redundant column at the time of normal accessing.

Referring to FIG. 9, in a program set 52 of redundancy determining circuit 40#0, assuming that all of bits A0 to An are set to be "0" as a replacement address, and all of bits D0 to D2, indicating which of eight regions provided by dividing each bank into half has a memory cell to be replaced, are also set to be "0." Moreover, assuming that both of redundancy selecting bits S0, S1, indicating which one of a plurality of pairs of redundant columns in the designated region is to be used, are also set to be "0".

In the case of normal accessing, the all-bank activation signal /ALBK is set to be "1." Comparing circuit 54 then performs normal comparing operation.

Assuming now that "0" is input for all of signal bits IA0 to IAn of an input address signal, and also "0" is input for both bits IB0 and IB1 of an input address bank signal.

Then, comparing circuit 54 detects that the replacement address agrees with the input address, and activates signal HIT to be "1." Control buses transmitting the redundancy activation signal and redundancy selection signal are provided corresponding to the eight regions designated by bits D0 to D3. Bus determining unit 56 outputs a signal selecting any one of the eight buses to bus selecting circuits 58 and 60, in accordance with bits D0 to D3.

Bus selecting circuit 58 outputs the redundancy activation signal to a designated bus. Bus selecting circuit 60 outputs the redundancy selection signal to a designated control bus.

Normally, the same replacement address as that of redundancy determining circuit 40#0 cannot be set to the other redundancy determining circuits 40#1 to 40#6. Thus, the redundancy activation signal and redundancy selection signal output from redundancy determining circuits 40#1 to 40#6 are being inactivated.

This means that a comparing circuit provided within each of the other redundancy determination circuits 40#1 to 40#6 never detects agreement of addresses, so that no activation signal is output from these circuits. As a result, OR circuit 62 outputs a redundancy activation signal DBUS0 to a data bus selected by bus determining unit 56 and transmitting data to one of the regions provided by dividing bank 0 into half. The other redundancy activation signals DBUS1 to DBUS7 are inactivated to be "0."

Thus, OR circuit 62 outputs the output of bus selecting circuit 58 as it is.

OR circuit 64 similarly outputs "0, 0" as redundancy selection signal SBUS0, and the other signals SBUS1 to SBUS7 are inactivated.

Main selecting circuit 4 provided corresponding to bank BANK0 includes redundant column selecting circuit 12 and redundant column selecting circuit 14 as shown in FIGS. 2 and 9. Redundant column selecting circuit 12 corresponds with selecting circuits 12a, 12b in FIG. 2. Moreover, redundant column selecting circuit 14 corresponds with selecting circuits 14a, 14b in FIG. 2.

To redundant column selecting circuit 12, "1" is transmitted as redundancy activation signal DBUS0 and "0, 0" is transmitted as redundancy selection signal SBUS.

Redundancy activation signal DBUS0 is activated, so that decoders 24, 34 in FIG. 2 are activated to decode redundancy selection signal SBUS0.

Address signal IA0 is "0," whereas /IA0, which is the determination signal thereof, is "1." In FIG. 2, output circuit 22 activated by signal /IA0 outputs an output signal of decoder 24, outputs "1" as a spare column selection signal SYS0#0, and outputs "0" as signals SYS0#1 to SYS0#4.

In addition, output circuit 32 has received signal IA0 and thus is inactivated, so that it outputs "0" as signals SYS0#5 to SYS0#7.

As such, spare column selection signal SYS0#0 is activated, and therefore replacement is performed in memory blocks MA0 and MA2, resulting the use of redundant columns CR0#0 and CR2#0.

Figure 10:
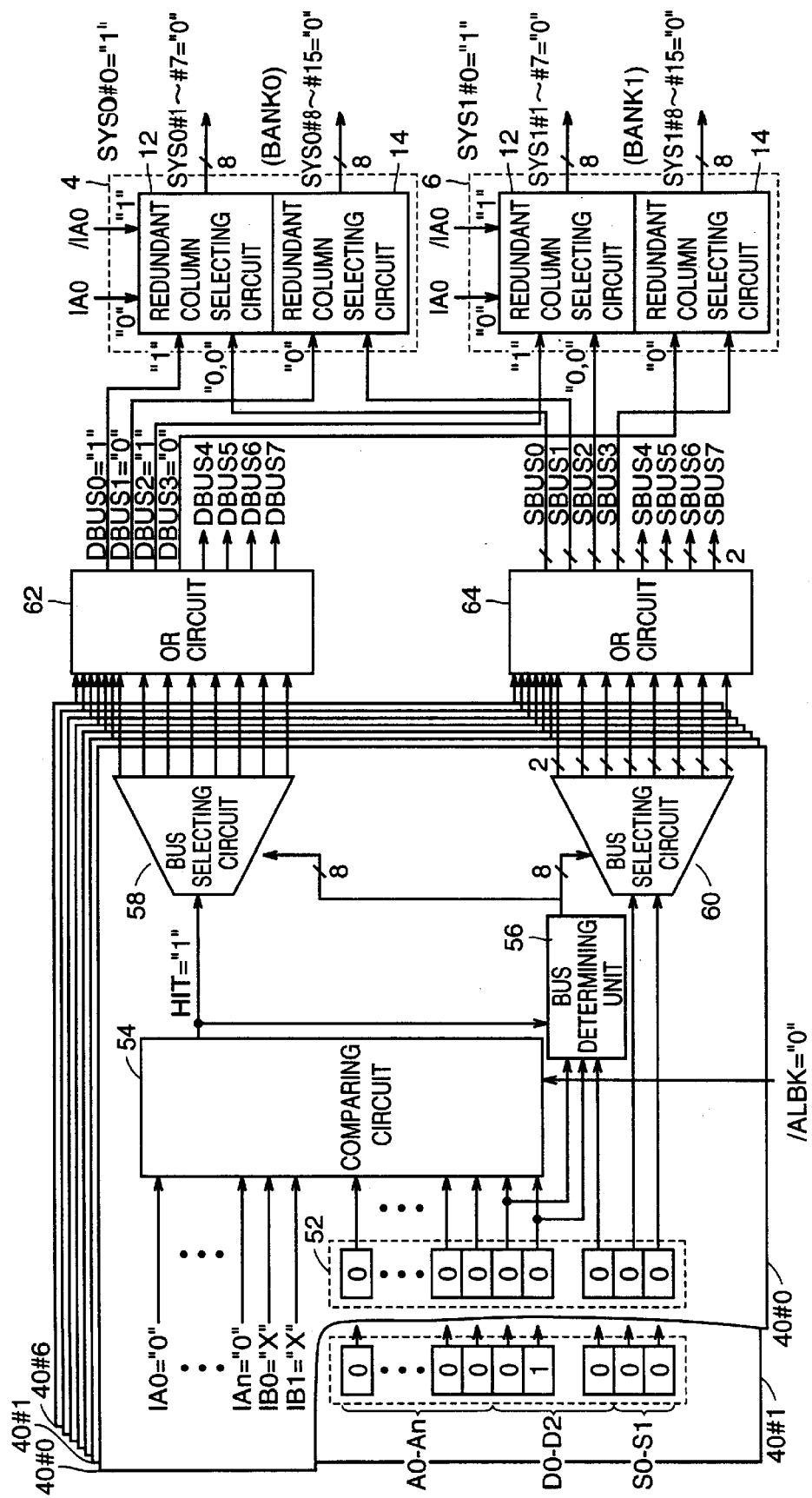
FIG. 10 is a schematic view illustrating the operation for selecting a redundant column at the time of all-bank accessing.
Figure 11:
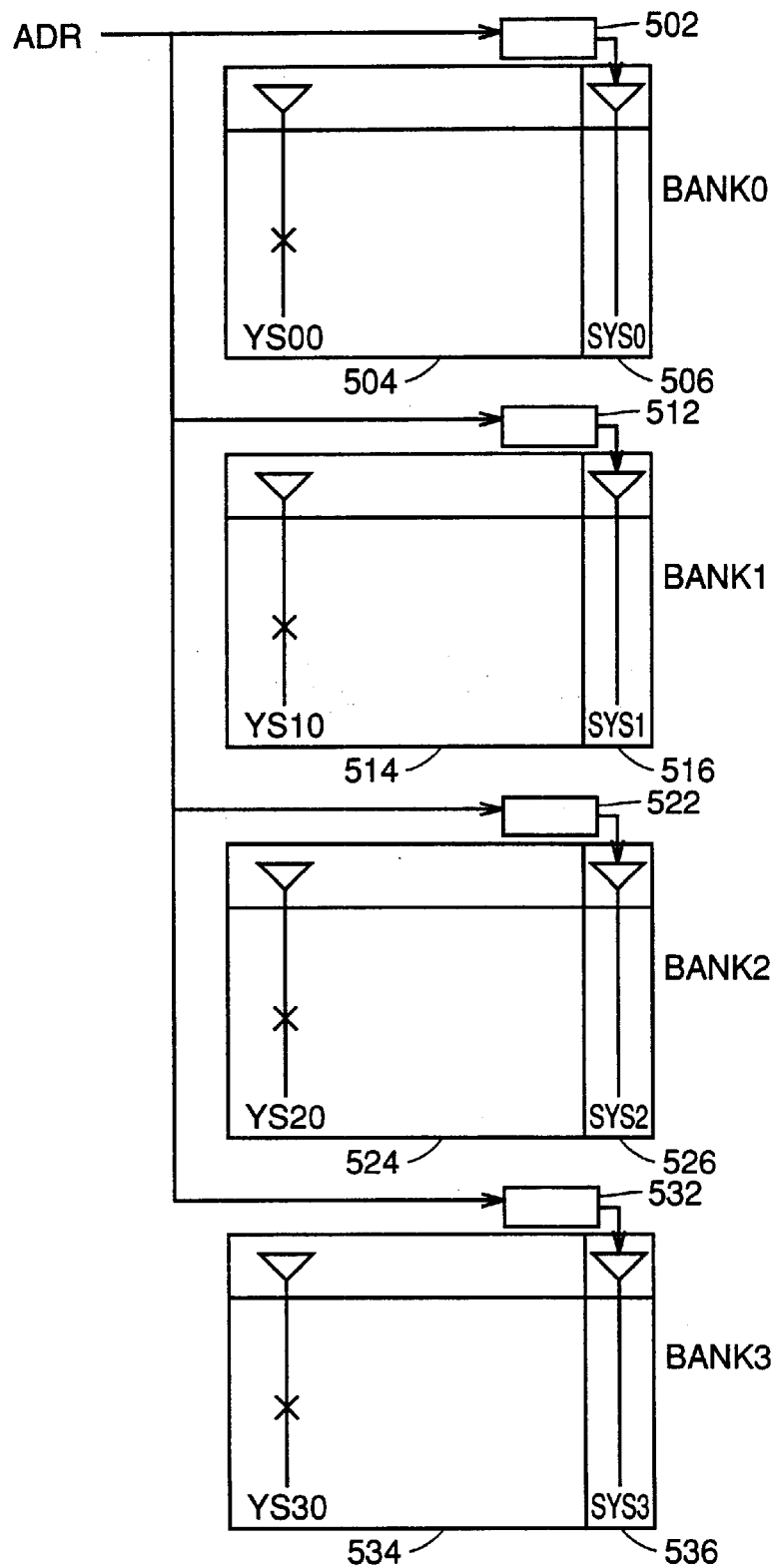
FIG. 11 is a schematic view showing the configuration of semiconductor memory device 500 including conventional redundant memory arrays.

FIG. 10 is a schematic view illustrating operation for selecting a redundant column at the time of all-bank accessing.

The semiconductor memory device has a normal mode and an all-bank access mode as operation modes. The all-bank access mode is a mode in which a plurality of banks are simultaneously activated in e.g. test operation or refresh operation. When the all-bank assess is performed, data may be read and written by simultaneously using a plurality of replacement memory cells.

Referring to FIG. 10, program set 52 included in redundancy 30 determining circuit 40#0 has the same setting as that shown in FIG. 9. On the other hand, in the program set in redundancy determining circuit 40#1, address bits A0 to An are all set to be "0," bits D0, D1 and D2 are set to be "0," "1," and "0" respectively, and bits S0, S1 are both set to be "0."

In the case of such setting, application of signal /ALBK set to be "0" inactivates comparing units 126 and 128 in FIG. 4, so that comparing circuit 54 performs no comparison with respect to the bank addresses and performs comparison only with respect to address bits A0 to An. Then, signal HIT is activated in both of redundancy determining circuits 40#0 and 40#1. As a result, "1" is output as redundancy activation signal DBUS0 in accordance with an output of bus selecting circuit 58 included in redundancy determination circuit 40#0. Moreover, "1" is output as redundancy activation signal DBUS2 in accordance with the output of bus selecting circuit 58 included in redundancy determining circuit 40#1.

For bank BANK0, a replacing operation similar to that described with reference to FIG. 9 is performed.

At the same time, for bank BANK1, the redundant column selecting circuit included in main selecting circuit 6 receives "1" as redundancy activation signal DBUS2, receives "0, 0" as redundancy activation signal SBUS2, and receives "0" and "1" as address bits IA0, /IA0 respectively, so that redundant column selection signal SYS1#0 is activated to be "1" whereas signals SYS1#1 to SYS1#15 are inactivated to be "0."

For redundancy selection in the all-bank access mode, the redundancy activation signal is divided into 1 bit and 2 bits. The redundancy activation signal is not the original 3-bit signal, so that redundancy in all banks can be used in the all-bank access mode. In the system of transmitting the original 3-bit signal, discrimination would be impossible in the all-bank access mode.

Thus, when the replacement address is programmed as shown in FIG. 10, the 0th redundant column of bank BANK0 and the 0th redundant column of bank BANK1 are simultaneously activated.

The case in which the same replacement address signals PA0 to PAn are set to a plurality of redundancy determining circuits 40, and only bit D1 corresponding to the bank address is differently set has been exemplified above. In such a case, a plurality of redundant columns can be simultaneously activated.

On the other hand, the plurality of redundancy determining circuits 40 may be simultaneously allocated to one of the eight regions provided by dividing each bank into half. In such a case, however, replacement address signals PA0 to PAn are set to be different for each of the circuit. This is because no identical replacement address can be normally set twice. Therefore, problems in operation can be avoided by providing eight control buses corresponding to the eight regions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

n memory regions, each of said n memory regions including
a normal memory region, and
a replacement region operating in place of a partial region of said normal memory region when an operation failure is found in said partial region;

n selecting circuits provided corresponding to said n memory regions respectively, and each selecting said replacement region instead of said partial region in accordance with selection information;

n control buses transmitting said selection information to said n selecting circuits respectively; and a setting circuit holding, when specified information indicating said partial region is set, said specified information in a non-volatile manner, and comparing an input address signal with said specified information, and outputting said selection information, said setting circuit including
m program sets setting m pieces of said specified information respectively, and
m bus selecting and outputting circuits selecting one of said n control buses in accordance with outputs of said m program sets respectively, and outputting said selection information,
said n being a natural number of at least 2, and said m being a natural number of at least 1.

2. The semiconductor memory device according to claim 1, wherein said replacement region includes a plurality of sub replacement regions;

said selection information includes
replacement execution information indicating that replacement address information agrees with said input address signal region, and
region-of-use information specifying any one of said plurality of sub replacement regions in any one of said n memory regions specified by said replacement address information; and each of said program sets has
a first holding circuit holding said replacement address information, and
a second holding circuit holding said region-of-use information.

3. The semiconductor memory device according to claim 2, wherein said replacement execution information includes one of m redundancy activation signals corresponding to said m program sets respectively, said region-of-use information includes one of m redundancy select signals each having plurality of bits, corresponding to said m program sets respectively, and each of said selecting circuits includes a decode circuit activated in accordance with one of said m redundancy activation signals transmitted by a corresponding one of said control buses, to decode said redundancy select signal transmitted by the corresponding one of said control buses.

4. The semiconductor memory device according to claim 3, wherein each of said sub replacement regions includes a plurality of redundant columns, said decode circuit outputs a plurality of activation signals activating said plurality of sub replacement regions respectively, and each of said plurality of activation signals activates corresponding said plurality of redundant columns together.

5. The semiconductor memory device according to claim 2, wherein m is smaller than a total number of said sub replacement regions.

6. The semiconductor memory device according to claim 1, wherein said replacement region includes a plurality of sub replacement regions; and each of said m program sets has
a first holding circuit holding a plurality of address bits of a replacement address corresponding to said partial region in which an operation failure occurs, and
a second holding circuit holding a plurality of redundancy select bits specifying any one of said plurality of sub replacement regions in any one of said n memory regions which is specified by said replacement address information.

7. The semiconductor memory device according to claim 6, wherein each of said m bus selecting and outputting circuits has
a bus determining unit reading a part of said plurality of address bits from a corresponding one of said program sets, and determining a control bus to be used in accordance with the read result, and
a bus selecting circuit reading a redundancy select bit from said program set in accordance with an output of said bus determining unit to output the read redundancy select bit to the determined control bus.

8. The semiconductor memory device according to claim 7, wherein said setting circuit further includes an OR circuit receiving an output of said bus selecting circuits included in said m bus selecting and outputting circuit, and outputting a logical sum operated per said control bus.

9. The semiconductor memory device according to claim 1, wherein said setting circuit further includes m comparing circuits receiving said address signal in common, to compare the signal with each of outputs of said m program sets, and said m bus selecting and outputting circuits are activated in accordance with outputs of said m comparing circuits respectively.

10. The semiconductor memory device according to claim 9, wherein said semiconductor memory device has a normal mode and a plural bank access mode as operation modes;

said address signal includes
a first group of bits indicating a bank address, and
a second group of bits specifying a memory cell in a bank; and said comparing circuit detects, in said normal mode, that both of said first and second groups of bits agree with corresponding portions of said address signal, and detects, in said plural bank access mode, that said second group of bits agree with a corresponding portion of said address signal irrespective of said first group of bits.

11. The semiconductor memory device according to claim 10, wherein said comparing circuit has
a pre-charge unit coupling a common node to a pre-charge potential, a first comparing unit coupling said common node to a fixed potential different from said pre-charge potential when said second group of bits agree with a corresponding part of said m program sets, and a second comparing unit activated in said normal mode to couple said common node to said fixed potential when said first group of bits agree with a corresponding part of said m program sets, and inactivated in said plural bank access mode to be separated from said common node.

* * * * *